United States Patent
Miyamoto et al.

(10) Patent No.: US 9,236,857 B2
(45) Date of Patent: Jan. 12, 2016

(54) VOLTAGE DETECTION CIRCUIT

(71) Applicant: PANASONIC CORPORATION, Osaka (JP)

(72) Inventors: Shinji Miyamoto, Osaka (JP); Ichiro Yamane, Kyoto (JP); Hirokuni Fujiyama, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/331,750

(22) Filed: Jul. 15, 2014

(65) Prior Publication Data

US 2014/0327476 A1    Nov. 6, 2014

Related U.S. Application Data

(63) Continuation of application No. PCT/JP2013/000629, filed on Feb. 6, 2013.

(30) Foreign Application Priority Data

Feb. 28, 2012  (JP) .................. 2012-041537

(51) Int. Cl.
    *H03K 5/153*    (2006.01)
    *H03K 17/22*    (2006.01)
(52) U.S. Cl.
    CPC .................... *H03K 17/223* (2013.01)
(58) Field of Classification Search
    CPC ........ H03K 17/22; H03K 5/08; H03K 5/2481
    USPC ..................................... 327/72–89
    See application file for complete search history.

(56) References Cited

U.S. PATENT DOCUMENTS

| | | | |
|---|---|---|---|
| 2005/0218969 A1 | 10/2005 | Yoshizawa | |
| 2010/0026268 A1* | 2/2010 | Chang et al. | 323/288 |
| 2010/0244805 A1 | 9/2010 | Fujita | |
| 2011/0267115 A1* | 11/2011 | Yamamoto et al. | 327/143 |

FOREIGN PATENT DOCUMENTS

| | | |
|---|---|---|
| JP | 07-016432 U | 3/1995 |
| JP | 2005-291865 A | 10/2005 |
| JP | 2010-223796 A | 10/2010 |
| JP | 2011-185802 A | 9/2011 |
| JP | 2012-178627 A | 9/2012 |

OTHER PUBLICATIONS

International Search Report issued in PCT/JP2013/000629, dated Mar. 5, 2013, with English translation.

* cited by examiner

*Primary Examiner* — Sibin Chen
*Assistant Examiner* — Metasebia Retebo
(74) *Attorney, Agent, or Firm* — McDermott Will & Emery LLP

(57) ABSTRACT

A voltage detection circuit includes a reference voltage and current supply configured to generate a reference voltage and a reference current; a switching element configured to shift from an off-state to an on-state when the reference voltage is higher than a predetermined threshold voltage; a current mirror circuit allowing a current corresponding to the reference current to flow through the switching element in the on-state; a capacitive element coupled in series to the current mirror circuit and charged with the current flowing through the switching element; and an inverter configured to output an enable signal activated based on a terminal voltage of the capacitive element.

15 Claims, 5 Drawing Sheets

VOLTAGE DETECTION CIRCUIT

CROSS-REFERENCE TO RELATED APPLICATIONS

This is a continuation of International Application No. PCT/JP2013/000629 filed on Feb. 6, 2013, which claims priority to Japanese Patent Application No. 2012-041537 filed on Feb. 28, 2012. The entire disclosures of these applications are incorporated by reference herein.

BACKGROUND

The present disclosure relates to voltage detection circuits utilized in power-on reset of, for example, semiconductor devices.

A reference voltage generated from a power supply voltage needs to be stable to normally operate an electronic circuit including a comparator, which receives the reference voltage as one of the inputs to be compared. However, when a power supply is turned on, the power supply voltage is low, thereby making the reference voltage unstable. To address this problem, a voltage detection circuit is practically used, which outputs an enable signal indicating whether or not a required reference voltage is obtained.

In order to detect rising of the output of a reference voltage supply or rising of the output of a reference current supply, conventional art include, between a power supply and ground, a first series circuit including a resistive element, a diode, and an N-channel MOS transistor in parallel to a second series circuit including a P-channel MOS transistor and a resistive element. A voltage at the coupling point between the resistive element and the diode is applied to the gate of the P-channel MOS transistor. A reference voltage or a reference current is used to control the operation of the N-channel MOS transistor. See, for example, Japanese Unexamined Patent Publication No. 2010-223796.

SUMMARY

In recent semiconductor devices, particularly in application to mobile devices, reduction in the area and the current consumption are highly demanded.

In the conventional art, however, the current continues to flow through the first and second series circuits, after a required reference voltage is obtained. If the current is to be kept at, for example, about several nA, and the power supply voltage is 3.3 V, the values of the resistive elements are of the order of hundreds of MΩ. That is, the resistive elements largely occupy the semiconductor chip area. As such, the conventional art cannot reduce both of the area and the current consumption.

Since actual reference voltages usually rise slowly, the enable signal may be erroneously activated before the required reference voltage is obtained in the conventional art.

It is an objective of the present disclosure to provide a voltage detection circuit reducing both of the area and the current consumption, and reducing erroneous operation.

In order to achieve the objective, the voltage detection circuit according to the present disclosure includes a reference voltage and current supply configured to generate a reference voltage and a reference current; a switching element configured to shift from an off-state to an on-state when the reference voltage or a voltage generated by a voltage output circuit based on the reference voltage is higher than a predetermined threshold voltage; a current mirror circuit allowing a current corresponding to the reference current to flow through the switching element in the on-state; a capacitive element coupled in series to the current mirror circuit, and charged with the current flowing through the switching element; and an output circuit configured to output an enable signal activated based on a terminal voltage of the capacitive element.

With this configuration, when the input voltage of the switching element is higher than the predetermined threshold voltage, the capacitive element starts being charged. The enable signal is activated after a delay time determined by the electrostatic capacitance and the charge current. That is, a sufficient time is secured to obtain the required reference voltage or the internal voltage before the enable signal is activated. This reduces erroneous operation. After the charging of the capacitive element has completed, no current flows into the capacitive element, thereby reducing current consumption. Even a small electrostatic capacitance obtains a required delay time to reduce the area.

The present disclosure reduces the current consumption and the area of the voltage detection circuit, and reduces erroneous operation of the voltage detection circuit. In addition, an electronic circuit at a subsequent stage accurately determines activation of the reference voltage and current supply or the voltage output circuit.

DETAILED DESCRIPTION

Embodiment of the present disclosure will be described hereinafter in detail with reference to the drawings.

First Embodiment

Figure 1:
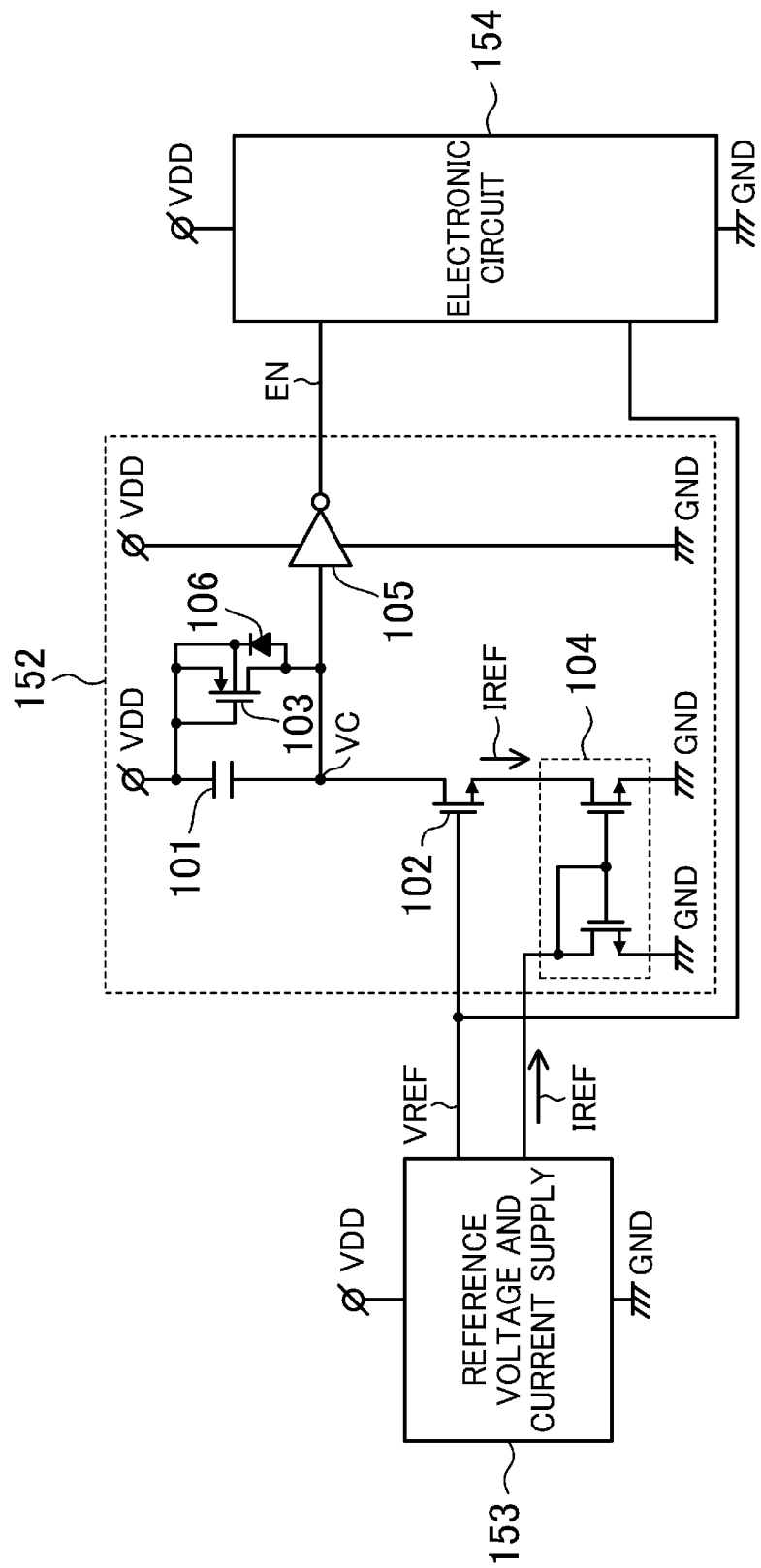
FIG. 1 is a circuit diagram including a voltage detection circuit according to a first embodiment of the present disclosure.

FIG. 1 is a circuit diagram including a voltage detection circuit according to a first embodiment of the present disclosure. The voltage detection circuit according to the first embodiment includes an enable signal output circuit 152 and a reference voltage and current supply 153. The voltage detection circuit supplies a reference voltage VREF and an enable signal EN to an electronic circuit 154. A power supply voltage VDD and a ground voltage GND are applied to the electronic circuit 154. The electronic circuit 154 receives the reference voltage VREF from the reference voltage and current supply 153, and the enable signal EN from the enable signal output circuit 152.

The reference voltage and current supply 153 is, for example, a bandgap reference circuit, which receives the power supply voltage VDD and the ground voltage GND, and generates the reference voltage VREF and a reference current IREF.

The enable signal output circuit 152 includes a capacitive element 101, a first switching element 102, a P-channel MOS transistor 103, a current mirror circuit 104, and an inverter 105. The first switching element 102 is an N-channel MOS transistor, which receives the reference voltage VREF at a gate. The first switching element 102 shifts from an off-state to an on-state, when the reference voltage VREF is higher than a gate threshold voltage Vth(102). The current mirror circuit 104 includes two N-channel MOS transistors, which receive the ground voltage GND at sources. When the first switching element 102 is in the on-state, the current mirror circuit 104 allows a current corresponding to the reference current IREF to flow through the first switching element 102. The capacitive element 101 is coupled between the power supply and the first switching element 102 to be charged with the current flowing through the first switching element 102. The inverter 105 is, for example, a CMOS inverter which receives the power supply voltage VDD and the ground voltage GND. The inverter 105 receives, at an input terminal, a terminal voltage of the capacitive element 101, that is, a voltage VC at the coupling point between the capacitive element 101 and the first switching element 102. The inverter 105 outputs the enable signal EN to the electronic circuit 154. The gate and the source of the P-channel MOS transistor 103 are coupled together. The P-channel MOS transistor 103 is arranged in parallel to the capacitive element 101 to discharge the capacitive element 101 through a body diode 106.

Figure 2:
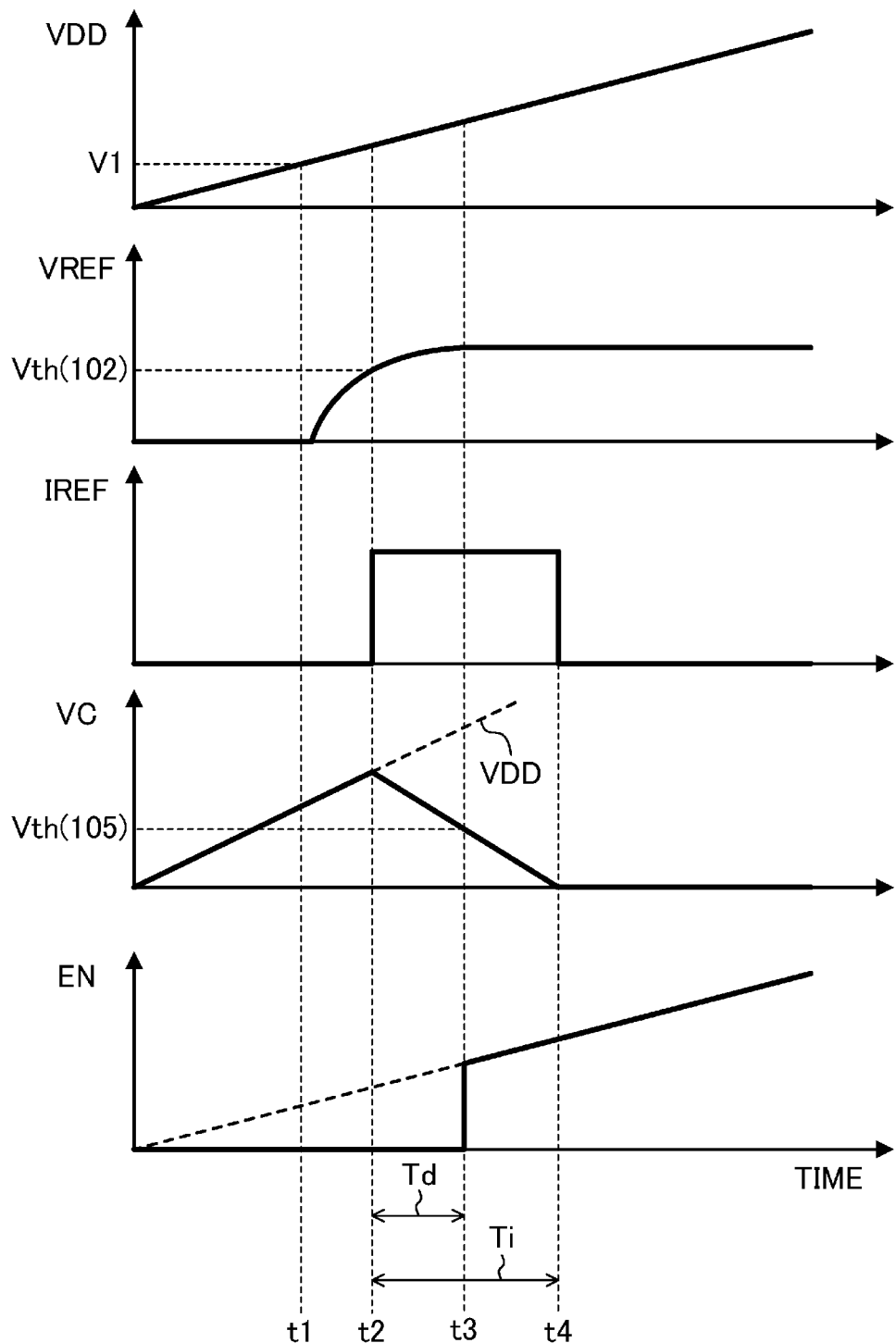
FIG. 2 is a time chart illustrating the operation of the voltage detection circuit of FIG. 1

FIG. 2 is a time chart illustrating the operation of the voltage detection circuit of FIG. 1. An example will be described where the power supply voltage VDD monotonously increases with time, immediately after turning on the power supply.

First, at the turn-on of the power supply, the capacitive element 101 holds no charge. The voltage between the terminals of the capacitive element 101 is 0 V. The first switching element 102 maintains the off-state. That is, the voltage VC at the coupling point between the capacitive element 101 and the first switching element 102 rises while maintaining the same potential as the power supply voltage VDD. On the other hand, the enable signal EN, which is the output of the inverter 105, maintains a low level (i.e., 0 V).

When the power supply voltage VDD reaches a voltage V1 at time t1, the reference voltage and current supply 153 is activated. At this time, the reference voltage VREF starts being output, the reference voltage VREF is applied to the gate of the first switching element 102.

When the reference voltage VREF reaches the threshold voltage Vth(102) of the first switching element 102 at time t2, the first switching element 102 is turned on, and the reference current IREF starts flowing. At this time, since the current mirror circuit 104 extracts charges from the capacitive element 101 at a constant speed using the reference current IREF, the coupling point voltage VC drops linearly with time. At this time, the slope ΔVC of the drop of the coupling point voltage is expressed by the following equation.

$$\Delta VC = (IREF \times t)/C$$

The reference character t represents the elapsed time, and C represents the electrostatic capacitance of the capacitive element 101. When the first switching element 102 is turned on, the reference voltage VREF has not yet reached to a required voltage.

When the coupling point voltage VC reaches the threshold voltage Vth(105) of the inverter 105 at time t3, the inverter 105 shifts the enable signal EN from the low level (i.e., 0 V) to the high level (i.e., VDD). That is, the inverter 105 outputs the activated enable signal EN to the electronic circuit 154. By setting a proper time as a delay time Td between time t2 and time t3, the erroneous operation is reduced, which activates the enable signal EN before the reference voltage VREF reaches the required voltage.

At time t4, the capacitive element 101 is fully charged. Since then, no reference current IREF flows through the first switching element 102. That is, the reference current IREF flows through the first switching element 102 only in the period Ti between time t2 and time t4. This reduces current consumption.

Upon receipt of the enable signal EN at the high level (VDD), which is activated in this manner, the electronic circuit 154 stably operates with reference to the reference voltage VREF, which has reached the required voltage. In this state, the current consumption of the enable signal output circuit 152 is zero.

When the power supply is shut down from the stable operation of the electronic circuit 154 and the power supply voltage VDD drops, the coupling point voltage VC is higher than the power supply voltage VDD, thereby turning on the body diode 106 of the P-channel MOS transistor 103. As a result, the capacitive element 101 is reliably discharged, and the capacitive element 101 is initialized.

Second Embodiment

Figure 3:
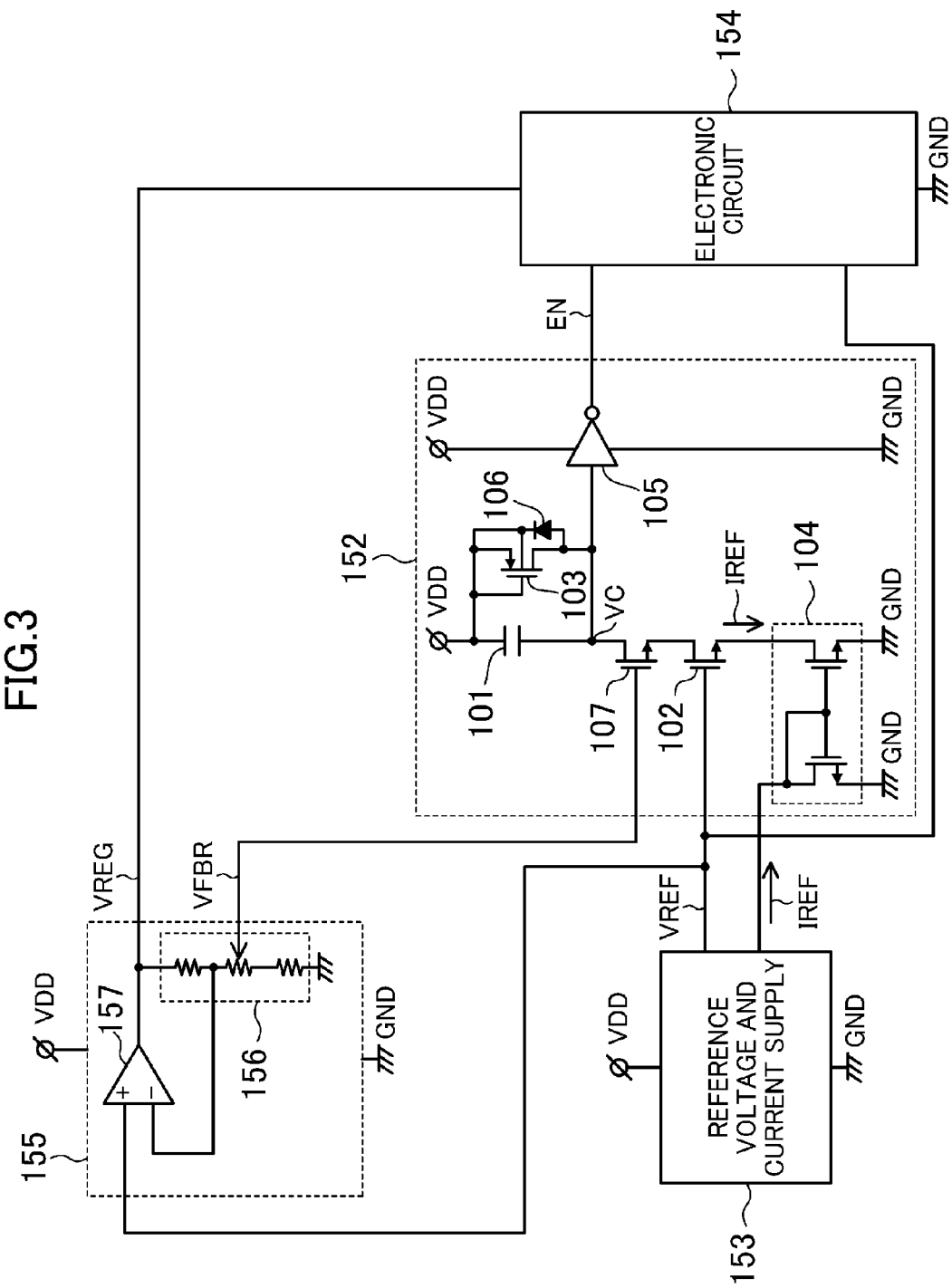
FIG. 3 is a circuit diagram including a voltage detection circuit according to a second embodiment of the present disclosure.

FIG. 3 is a circuit diagram including a voltage detection circuit according to a second embodiment of the present disclosure. In this embodiment, a voltage output circuit 155 and a second switching element 107 are added to the configuration of FIG. 1.

The voltage output circuit 155 operates upon receipt of the power supply voltage VDD and the ground voltage GND. The voltage output circuit 155 generates a regulator voltage VREG based on the reference voltage VREF, and supplies this regulator voltage VREG to the electronic circuit 154 as an inner power supply voltage. The voltage output circuit 155 includes, for example, an operational amplifier 157 and a resistance divider circuit 156. For example, the power supply voltage VDD is 3.3 V, and the regulator voltage VREG is 1.8 V. The resistance divider circuit 156 generates from the regulator voltage VREG, a feedback voltage to the operational amplifier 157. The resistance divider circuit 156 functions to adjust a regulator feedback voltage VFBR supplied to the second switching element 107 to monitor the feedback voltage.

The second switching element 107 is an N-channel MOS transistor, which is coupled in series to the capacitive element 101 and the first switching element 102. The second switching element 107 receives, at a gate, the regulator feedback voltage VFBR from the voltage output circuit 155 as an internal voltage. When this regulator feedback voltage VFBR is higher than a predetermined threshold voltage Vth(107), the second switching element 107 shifts from the off-state to the on-state.

Figure 4:
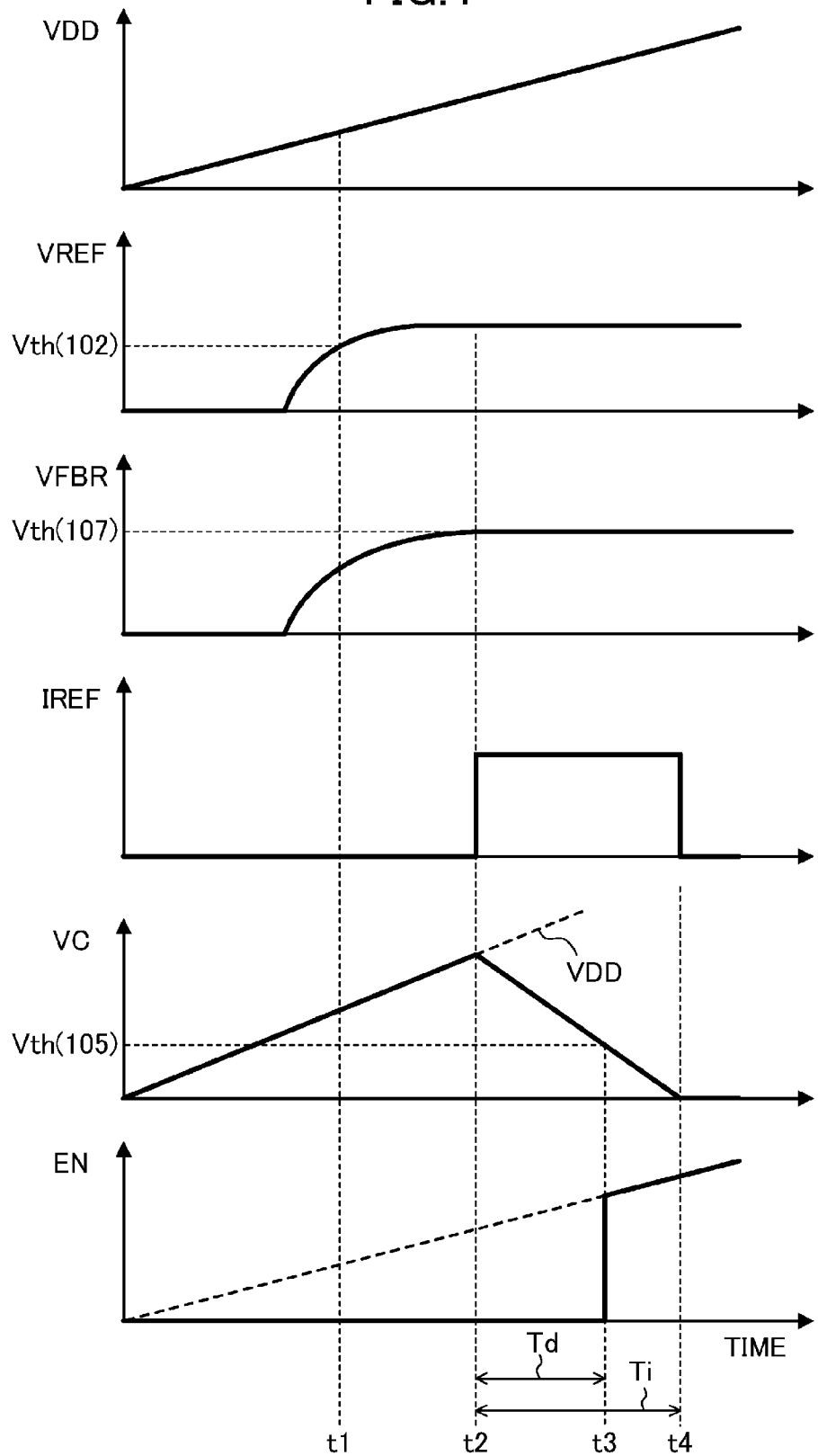
FIG. 4 is a time chart illustrating the operation of the voltage detection circuit of FIG. 3.

FIG. 4 is a time chart illustrating the operation of the voltage detection circuit of FIG. 3. In FIG. 4, after applying the power supply voltage VDD, the reference voltage VREF reaches the threshold voltage Vth(102) of the first switching element 102 at time t1, and the first switching element 102 is turned on. At this time, the reference voltage VREF is transient, and thus the regulator feedback voltage VFBR is also transient. Since this regulator feedback voltage VFBR does not reach the threshold voltage Vth(107) of the second switching element 107, the second switching element 107 is in the off-state, and the reference current IREF does not flow into the series circuit of the first switching element 102 and the second switching element 107. Therefore, the voltage VC at the coupling point between the capacitive element 101 and the second switching element 107 rises while maintaining the same potential as the power supply voltage VDD.

When the regulator feedback voltage VFBR reaches the threshold voltage Vth(107) of the second switching element 107 at time t2, the second switching element 107 is turned on. Then, the first switching element 102 and the second switching element 107 are both turned on. As a result, the reference current IREF starts flowing to start charging the capacitive element 101. The subsequent operation is the same as that in the first embodiment, and the explanation thereof is omitted.

As described above, in the second embodiment, the reference voltage VREF and the regulator feedback voltage VFBR are detected to output the enable signal EN, thereby reducing erroneous operation of the electronic circuit 154 using the regulator voltage VREG as an inner power supply voltage.

Similar advantages are obtained by exchanging the positions of the first switching element 102 and the second switching element 107 in FIG. 3.

Third Embodiment

Figure 5:
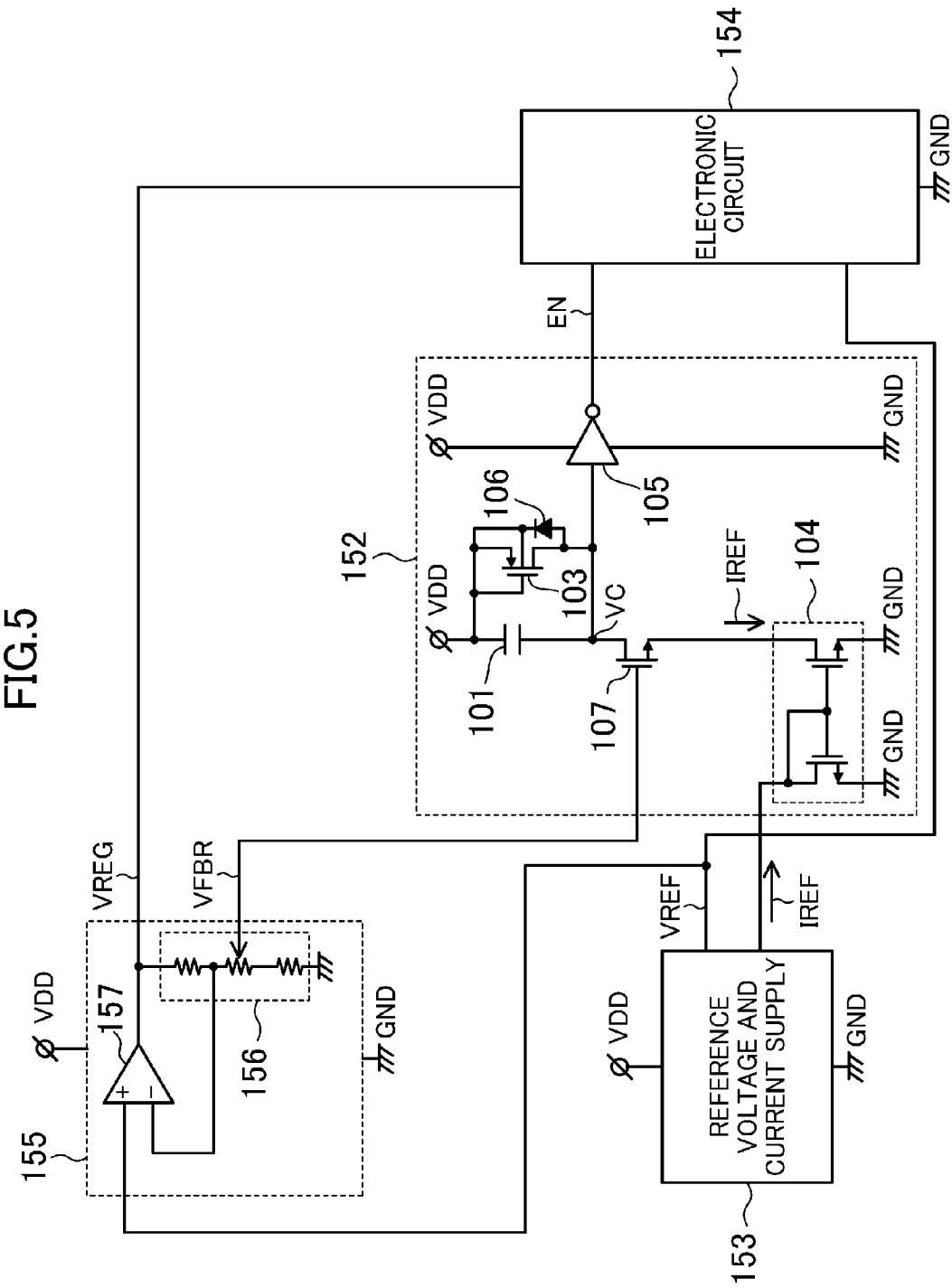
FIG. 5 is a circuit diagram including a voltage detection circuit according to a third embodiment of the present disclosure.

FIG. 5 is a circuit diagram including a voltage detection circuit according to a third embodiment of the present disclosure. In this embodiment, the first switching element 102 is deleted from the configuration of FIG. 3, and the second switching element 107 is directly coupled to the current mirror circuit 104.

In the third embodiment, the regulator feedback voltage VFBR is detected to output the enable signal EN, thereby reducing erroneous operation of the electronic circuit 154 using the regulator voltage VREG as an inner power supply voltage.

While the first to third embodiments have been described above, various modifications and changes may be made in the present disclosure. For example, when three or more voltages are to be detected, a series circuit including three or more switching elements corresponding to the voltages may be inserted between the capacitive element 101 and the current mirror circuit 104.

Where the enable signal EN is at the low level in the electronic circuit 154, there is no need to include the inverter 105 having the function of logic inversion at the output stage of the enable signal output circuit 152.

As described above, the voltage detection circuit according to the present disclosure reduces both of the area and the current consumption, and reduces erroneous operation, and is thus useful as power-on reset techniques, etc. Therefore, the present disclosure can be utilized for electronic devices such as electrical household appliances, alarms, clocks, power meters, and specified low power radios.

What is claimed is:

1. A voltage detection circuit comprising:
a reference voltage and current supply configured to generate a reference voltage and a reference current;
a first switching element having a first gate which receives the reference voltage or a voltage generated by a voltage output circuit based on the reference voltage, configured to shift from an off-state to an on-state when the applied voltage at the first gate is higher than a predetermined first threshold voltage, the reference voltage or the voltage generated by a voltage output circuit based on the reference voltage being generated without utilizing any comparator;
a current mirror circuit allowing a current corresponding to the reference current to flow through the first switching element in the on-state;
a capacitive element coupled in series to the current mirror circuit, and charged with the current flowing through the first switching element; and
an output circuit configured to output an enable signal activated based on a terminal voltage of the capacitive element.

2. The voltage detection circuit of claim 1, wherein the first switching element is an N-channel MOS transistor.

3. The voltage detection circuit of claim 1, further comprising:
a discharge circuit configured to discharge the capacitive element.

4. The voltage detection circuit of claim 3, wherein
the discharge circuit includes a P-channel MOS transistor arranged in parallel to the capacitive element, and
a gate and a source of the P-channel MOS transistor are coupled together to discharge the capacitive element through a body diode of the P-channel MOS transistor.

5. The voltage detection circuit of claim 1, wherein the output circuit includes an inverter configured to receive the terminal voltage of the capacitive element at an input terminal.

6. The voltage detection circuit of claim 1, further comprising:
a voltage output circuit configured to generate an internal voltage from the reference voltage; and
a second switching element having a second gate which receives a voltage generated by the voltage output circuit based on the reference voltage, configured to shift from an off-state to an on-state when the applied voltage at the second gate is higher than a predetermined second threshold voltage,
wherein the voltage output circuit supply the internal voltage to the second switching element.

7. The voltage detection circuit of claim 6, wherein the voltage output circuit includes a resistance divider circuit for adjusting a voltage to be supplied to the second switching element.

8. The voltage detection circuit of claim 6, wherein the second switching element is an N-channel MOS transistor configured to receive a voltage supplied from the voltage output circuit at a gate.

9. An electronic circuit determining activation of the reference voltage and current supply based on an output of the voltage detection circuit of claim 1.

10. An electronic circuit determining activation of the reference voltage and current supply based on an output of the voltage detection circuit of claim 6.

11. The voltage detection circuit of claim 6, wherein the second switching element is an N-channel MOS transistor.

12. The voltage detection circuit of claim 6, further comprising:
a discharge circuit configured to discharge the capacitive element.

13. The voltage detection circuit of claim 12, wherein
the discharge circuit includes a P-channel MOS transistor arranged in parallel to the capacitive element, and
a gate and a source of the P-channel MOS transistor are coupled together to discharge the capacitive element through a body diode of the P-channel MOS transistor.

14. The voltage detection circuit of claim 6, wherein the output circuit includes an inverter configured to receive the terminal voltage of the capacitive element at an input terminal.

15. The voltage detection circuit of claim 6, wherein the second gate of the second switching element receives the reference voltage without any comparator.

* * * * *